United States Patent
Baselmans et al.

(10) Patent No.: US 7,436,502 B2
(45) Date of Patent: Oct. 14, 2008

(54) ILLUMINATION BEAM MEASUREMENT

(75) Inventors: Johannes Jacobus Matheus Baselmans, Oirscho (NL); Henricus Jozef Peter Lenders, Heibloem (NL); Dilek Kaya, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 309 days.

(21) Appl. No.: 11/236,850

(22) Filed: Sep. 28, 2005

(65) Prior Publication Data

US 2007/0070329 A1    Mar. 29, 2007

(51) Int. Cl.
 *G01J 1/00* (2006.01)

(52) U.S. Cl. ...................................................... 356/121
(58) Field of Classification Search ....................... None
See application file for complete search history.

(56) References Cited

U.S. PATENT DOCUMENTS 6,710,856 B2 *   3/2004   Van Der Laan et al. ....... 355/71

* cited by examiner

*Primary Examiner*—Gregory J Toatley, Jr.
*Assistant Examiner*—Amanda H Merlino
(74) *Attorney, Agent, or Firm*—Pillsbury Winthrop Shaw Pittman, LLP

(57) ABSTRACT

A method of measuring the angular intensity distribution of an illumination beam produced by an illumination system of a lithographic apparatus includes measuring an angular intensity distribution, placing a first optical element above an object plane of the illumination system which causes light therefrom to be deflected in a first direction, and measuring the intensity distribution at said detector, placing a second optical element above said object plane which cases light from said illumination system to be deflected in a second direction, and measuring the intensity distribution at said detector, determining the change in intensity in said first and second directions, and the angular intensity distribution of said illumination beam from the measurements. There is also provided a mask for use in such a method, the mask comprising a plurality of modules, each module comprising a pinhole and an optical element mounted above the pinhole.

18 Claims, 3 Drawing Sheets

ILLUMINATION BEAM MEASUREMENT

FIELD

The present invention relates to a method of measuring the angular intensity distribution of an illumination beam produced by an illumination system of a lithographic apparatus, a mask for use in such a method, and to a method of measuring the response of a detector.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the prior art it is known to use pupil sensors at substrate level to measure the illumination pupil uniformity. The sensor angular response is measured off-line, predicted by theory, or measured with a reference illumination filling. Accuracy of the pupil measurement is limited to the accuracy of the reference. It is not an absolute pupil measurement, but a relative one. The measurement is always compared to a (more or less) known reference.

SUMMARY

An object of the invention is to find the angular distribution of the illumination beam when it leaves the illuminator (i.e. before it is incident upon the mask). Ideally, the intensity of illumination should be the same over all angles. In practice, there will be variations of the intensity with respect to the angle.

The invention provides a method of measuring the angular intensity distribution of an illumination beam produced by an illumination system of a lithographic apparatus which includes:

Said illumination system which is configured to condition a radiation beam and to focus the radiation beam in an object plane, a support constructed to support a patterning device for imparting the radiation beam with a pattern in its cross-section to form a patterned radiation beam, a substrate table constructed to hold a substrate, and a projection system configured to project the patterned radiation beam onto a target portion of the substrate, wherein the method includes, placing a detector downstream of said projection system, and measuring the angular intensity distribution at said detector to produce a first measurement, placing a first optical element above said object plane which causes light from said illumination system to be deflected in a first direction, and measuring the intensity distribution at said detector to produce a second measurement, placing a second optical element above said object plane which causes light from said illumination system to be deflected in a second direction, and measuring the intensity distribution at said detector to produce a third measurement, using said first, second and third measurements to determine the change in intensity in said first and second directions, and the angular intensity distribution of said illumination beam.

Said first and second optical elements may be the same optical element, and the optical element may be used with different rotations when serving as said first and second optical elements.

Said first and second optical elements may be wedges.

In one embodiment, said first optical element is replaced by the second optical element during said step of placing the second optical element above said object plane.

Said optical elements may be made from synthetic quartz or fused silica, among other materials.

In an embodiment of the invention the illumination system and the projection system each have a pupil, and each of said optical elements causes light from the same part of the illumination system pupil to pass through a different part of the projection system pupil, and the method includes using this fact to separate the transmission characteristics of the projection system from the illumination distribution of the illumination beam.

The method may further comprise the step of introducing one or more optical elements between the projection system and the detector, and calculating the transmission characteristics of the projection system separately from the response of the detector.

The method may further comprise rotating the detector, and calculating the transmission characteristics of the projection system separately from the response of the detector.

The invention also provides a mask for use in a method of measuring the angular intensity distribution of an illumination beam of an illumination system of a lithographic apparatus, the mask including a plurality of modules, with each module comprising a pinhole and an optical element mounted above the pinhole.

In one embodiment, each optical element is wedge shaped.

Said optical elements may be made from synthetic quartz or fused silica, among other materials.

Said optical elements may be arranged so that different optical elements cause light from said illumination system to be deflected in different directions.

In one embodiment the mask is formed from a substrate and the pinhole of each module is positioned at the bottom of the substrate, and the optical element of each module is positioned at the top of the substrate, where the top of the substrate is the side of the substrate which is nearest to said illumination system in use.

The invention also provides a method of measuring the response of a detector to light falling on the detector, the method including passing light through the projection system of a lithographic apparatus, positioning the detector downstream of the projection system, measuring the intensity distribution at said detector to produce a first intensity distribution measurement, rotating the detector and then measuring the intensity distribution at said detector to produce a second intensity distribution measurement, and comparing said first and second intensity distribution measurements to calculate the detector response separately from the transmission characteristics of the projection system.

The method may also include measuring the angular intensity distribution of an illumination beam produced by an illumination system of the lithographic apparatus by following any of the steps of the method above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
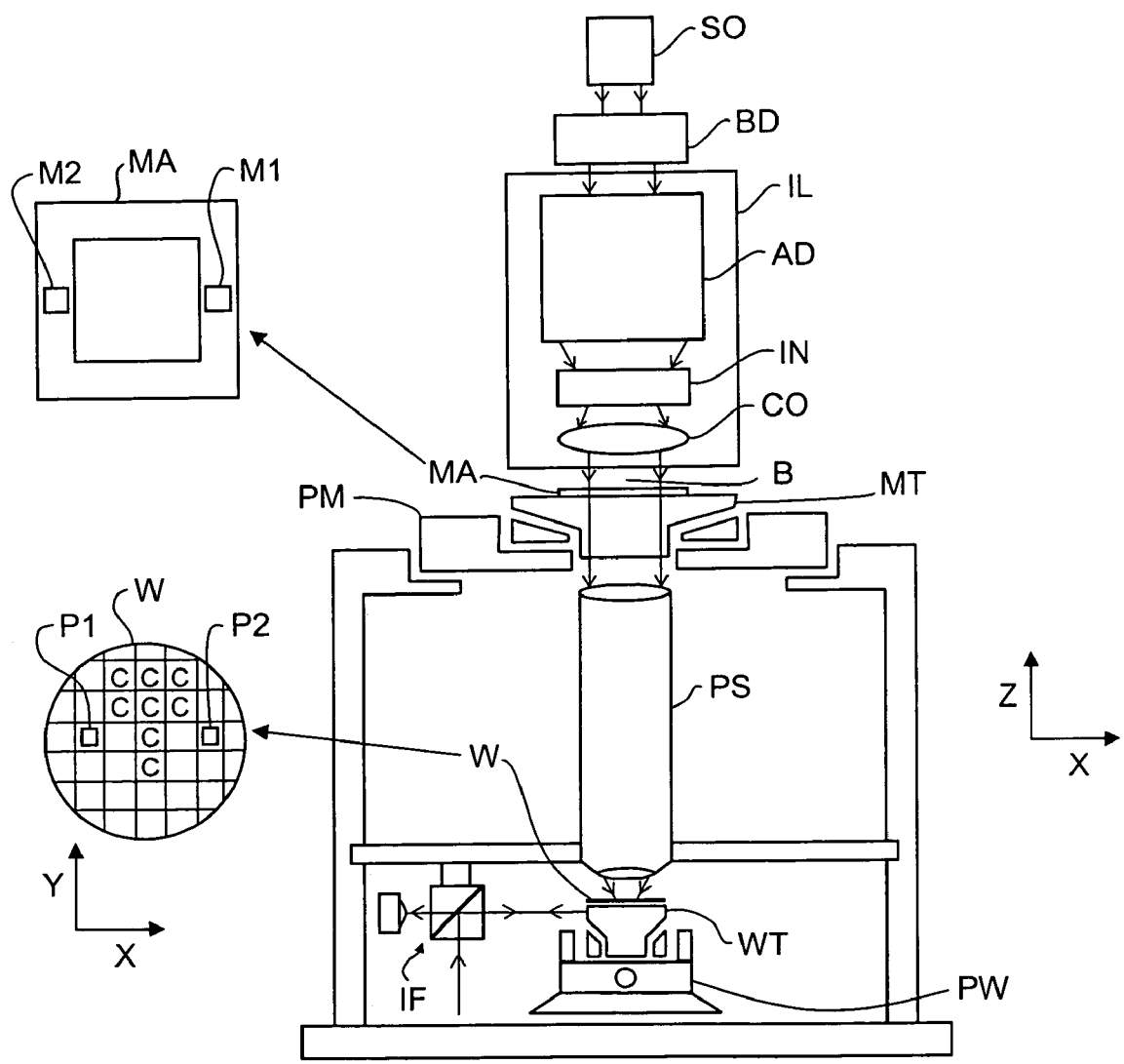
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the. lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As shown in FIG. 1, a schematic optical system may be considered to comprise the illuminator IL and a projection system PS comprising a projection lens. A detector may be positioned at the position of the wafer W. The intensity of radiation leaving the illuminator is a function of angle from the illuminator and may be denoted as $I(\theta)$. This light passes through the projection lens of the projection system PS, which will have some effect on the angular intensity distribution. This effect may be denoted $T(\theta)$. The light transmitted from the projection lens will have a modified angular intensity distribution which may be denoted $l(\theta)$. The detector detects the angular distribution of the light by measuring a spatial distribution of light intensity. If the detector measures the light at equidistant points in the far field, the locations at which it measures are distributed according to the tangents of the elevation angle:

$$(x, y) = (D \tan(\theta)\sin(\phi), D \tan(\theta)\cos(\phi))$$

where

D equals the distance between the detector & pinhole, $\theta$ equals the elevation angle $\phi$ equals the azimuth angle Simple math can be used to calculate the angles $\theta$ and $\phi$ with respect to the optical axis of the projection system.

In an alternative arrangement a lens may be located above the detector to convert the angular distribution of the light to a spatial distribution. In the case of a lens between the pinhole and detector, the above equation becomes:

$$(x, y) = (F \sin(\theta)\sin(\phi), F \sin(\theta)\cos(\phi))$$

where F equals the Focal length of the lens.

The general problem with measuring the angular intensity distribution of light from the illuminator IL is that the detector is located below the projection lens of the projection system PS. This means that the projection lens has an influence on the detected signal, i.e. the detector output is not simply the angular distribution of light from the illuminator IL.

In the prior art, a special source is used to determine the transmission of the projection lens and the response of the detector (these are determined together). The source may comprise a diffuser, which washes out all of the angles in the light from the illuminator, so that the angular distribution of the light is effectively flat. Alternatively, the source may comprise a lens located above a pinhole, arranged to form a very wide wavefront which is effectively flat. The problem with this method is that the angular distribution of the light is never fully flat, and so must be calibrated. The calibration must be performed separately on a test-rig. Performing a separate calibration in this way is liable to introduce errors, since the conditions of the calibration measurement are never identical to the conditions under which the source is used inside the lithographic apparatus.

Figure 2:
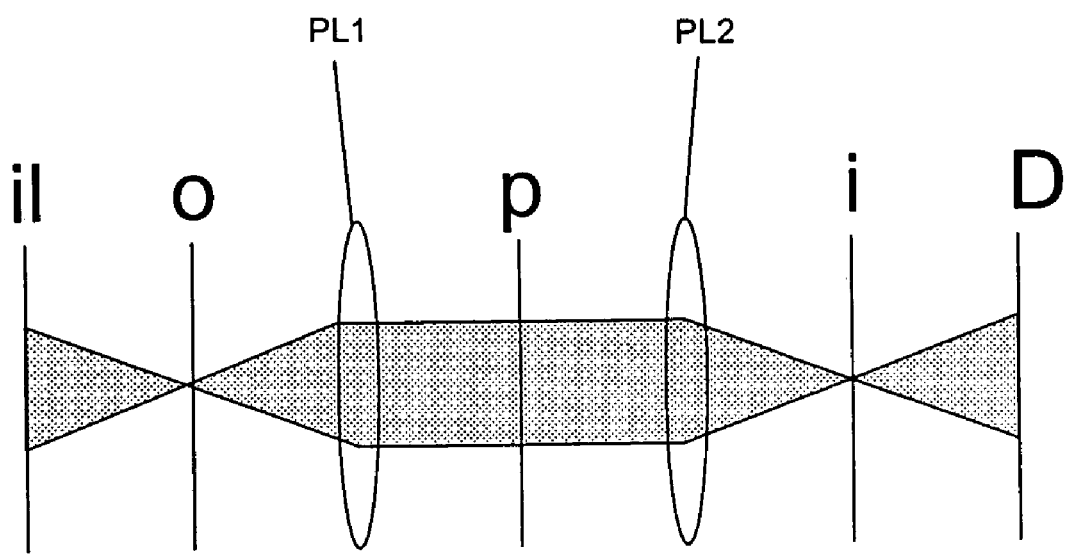
FIG. 2 is a schematic diagram showing how light passes from the illuminator, via a projection lens to a detector.

FIG. 2 is a schematic diagram in which "il" represents the pupil plane of the illuminator IL; "o" is the object plane which may be provided with a pinhole; "p" represents the pupil plane of the projection lens of the projection system PS, which is represented schematically by two lenses PL1 and PL2; "i" represents an image of the object plane (for example and image of the pinhole); and D represents the detector.

The concept of a pupil plane may be understood be realising that a spatial distribution of light will be mapped by a lens to an angular distribution of the light at the pupil plane of the lens. That is, each position in the spatial distribution corresponds to an angle at the pupil. This is illustrated schematically in FIG. 2. FIG. 2 also shows the effect of locating a pin hole in the object plane "o" located above the projection lens (PL1, PL2).

Figure 3:
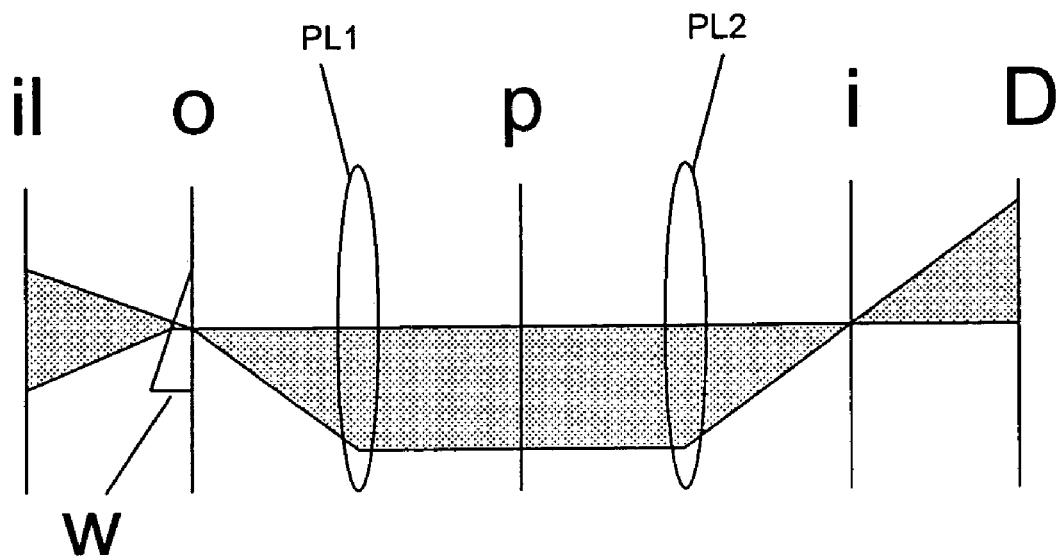
FIG. 3 is the same schematic diagram as FIG. 2, but showing the effect of adding a wedge at the object plane.

FIG. 3 shows an embodiment of the invention which, instead of using a dedicated source, positions a wedge W in the focal plane of the illuminator IL (i.e. the object plane "o", which is the location of the mask MA during conventional lithography). The wedge may be made from synthetic quartz, fused silica, or any glass which is transparent at the exposure wavelength, for example. Two or more wedges may be provided on a mask, and can be easily introduced into the lithographic apparatus in the same way that a mask is introduced (ie using the same input-output port which is provided for masks on many lithographic apparatuses).

Figure 4:
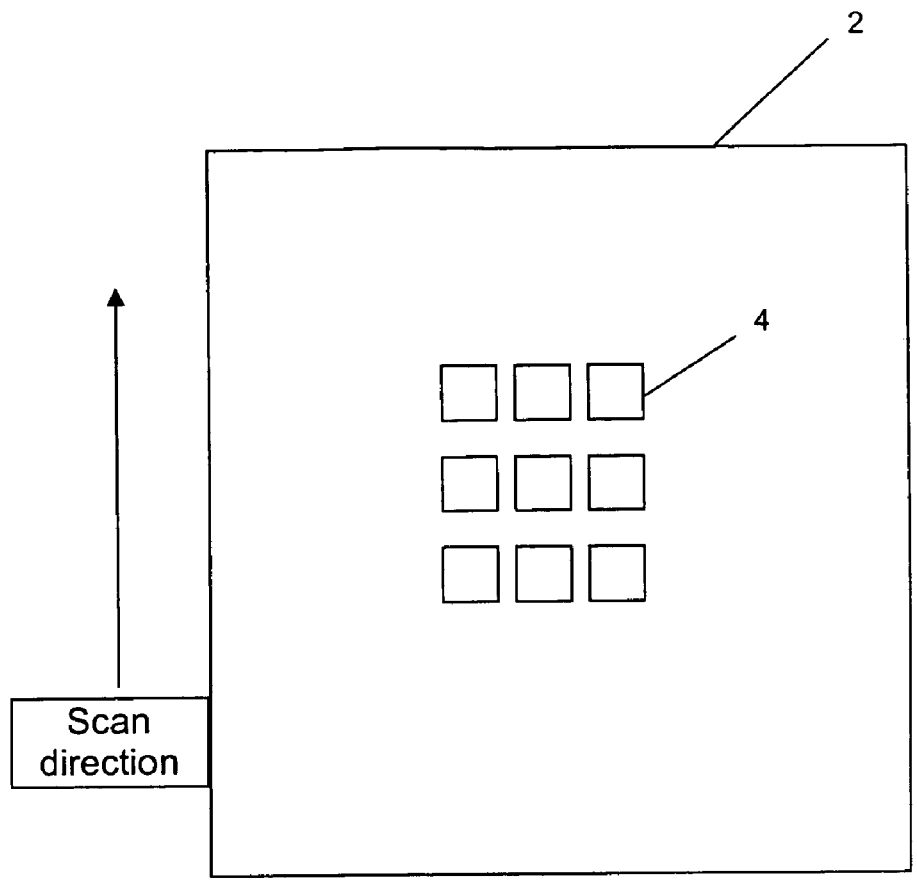
FIG. 4 shows a special mask containing a number of modules.

As shown in FIG. 4, a special mask 2 may be provided with a number of modules 4, with each module 4 comprising a pinhole at the bottom of the substrate and a wedge mounted on top of the substrate. Within the scan direction (indicated in FIG. 4), multiple wedge orientations may be present. This allows multiple wedge orientations to be selected by selecting different y positions (within the scan direction). The wedges may be used one after the other.

The detector D is used to detect the spatial intensity of light beneath the projection lens (PL1, PL2) in the normal way. The first measurement is performed in the absence of a wedge. Following this, the wedge W is introduced, with the effect that the light from the illuminator IL is directed at a slightly different angle, and forms an image on a slightly different location on the detector D. The wedge may be selected so that the image at the detector D is shifted by a distance which is equivalent to one pixel on the detector D, or maybe shifted more than this. One pixel would be the minimum shift. The first wedge is arranged to move the image in a particular direction, for example in the X direction. The detector D then detects the image. A second wedge is used to shift the light in a different direction, for example the Y direction. Again, the detector D is used to detect the image of the light.

By placing a wedge at the object level (between the illuminator IL & the object plane "o"), the light goes through a different part of the projection lens pupil "p". That is, light from the same part of the illuminator pupil "il" passes through a different part of the projection lens pupil "p". This allows the transmission characteristics of the projection system PS to be separated from the illumination distribution of the illuminator IL, thus allowing the precise variation of the illumination pattern of the illuminator IL to be determined.

For the ease of the discussion we assume a perfect wedge (100%) transmission. In reality, one needs to take into account the transmission coefficients for the different angles.

The result of using the wedges is that a given point of light in the beam will be detected at three different locations on the detector D. The difference between the intensity measured at the unshifted (reference) location and the X-shifted location is determined for each point of light. The result of this is a gradient intensity. Similarly, a gradient intensity is determined for the Y-direction. The intensity profile of the beam is then reconstructed from this information. Conceptually, this is equivalent to reconstructing a mountain based upon knowing the gradient in two directions at all points.

An advantage of the invention is that it is self-referencing. In other words, there is no need to obtain a reference measurement on an off-line calibration rig.

Figure 5:
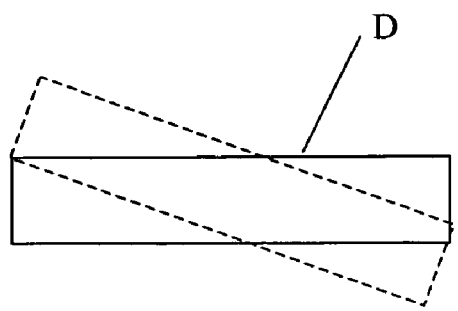
FIG. 5 shows rotation of the detector.

The same measurement may be repeated by introducing a wedge between the projection lens and the detector. This has the advantage that it allows the effect of the projection lens to be separately determined from the response of the detector. In practice however, it may be difficult to introduce a wedge at this location. An alternative to introducing the wedge would be to rotate the detector D as shown in FIG. 5. Because the rotation needed would be very small, it may that a translation would be sufficient, the movement being so small that the lack of angular rotation does not introduce significant errors Although no separate reference measurement is needed when the invention is used, the optical properties of the wedge should be taken into account. This would include the drop in intensity caused for example by multiple reflections from the surfaces of the wedge, and any optical scattering that may be caused by the material of the wedge. A non-wedged piece of the same material may be included on the mask for reference measurement, to minimize the optical effect of the wedge on the measurement.

At the detector D (positioned at the substrate level) a combination of the projection lens (PL1, PL2) transmission and illumination intensity of the illuminator IL is measured. Three cases are measured, namely: no wedge, small x-shift, small y-shift.

By taking the difference of the shifted with the non-shifted measurement, the lens transmission is divided out:

$$dI_x(x,y) = I_{x\text{-}shift}(x,y) - I_{reference}(x,y); \quad dI_y(x,y) = I_{y\text{-}shift}(x,y) - I_{reference}(x,y)$$

But instead of an intensity, the parameter obtained is a intensity difference over a small distance, close to an intensity gradient (in the x- and y-direction).

By using of some reconstruction algorithms used within shearing metrology, the original illumination intensity of the illuminator IL can be calculated (except for a mean value, as one can never separate the mean projection lens transmission from the illuminator illumination intensity, using only measurements at substrate level.)

Suitable shearing mathematics will now be briefly described. At each point in the object/image plane of the projection lens, the intensity difference in the illuminator pupil is measured as an input for the calculation. After the measurement intensity (I) over the pupil (x, y), one starts a calculation, where at the end of the calculation the intensity distribution over the illumination pupil is extracted independent of the detector and projection lens characteristics.

$$X(x, y) = I(x, y) - I(x - s, y) \quad \leftrightarrow \quad X_{r,k} = I_{r,k} - I_{r-1,k}$$
$$Y(x, y) = I(x, y) - I(x, y - s) \quad \quad\quad Y_{r,k} = I_{r,k} - I_{r,k-1}$$

where $$I_{r,k} = I(r \cdot s, k \cdot s)$$

In the formulae above, the right part shows the discrete version of the left part. The measurements are measured at "s" pupil spacing. "s" is the shift in the pupil plane, which is realised by placing a wedge at the object plane. Each angle within the object/image plane corresponds with a coordinate in the pupil plane, and vice versa. There are twice as many independent "measurements" (=measured intensity distribution difference: $X_{r,k}$ & $Y_{r,k}$) as unknowns (the pupil intensity distribution: $I_{r,k}$).

The separation value "s" may be the same in the X and Y directions, but this is not strictly necessary. Least square equations in a matrix arrangement may be used to determine a map of the intensity. This is because there are roughly twice as many measurements as unknown values. An average value of the intensities is needed, but this can be introduced as an artificial value, for example 1 or zero. Conceptually, this would be equivalent to providing a value for sea level when mapping the topography of the mountain mentioned above. The values "k" and "r" are the shifts in the x and y directions respectively of the light due to the wedges. "k" and "r" are the column and row index numbers, which are integer numbers. "k s" and "r s" are the pupil coordinates.

It is not essential that the grid separation "s" is equal to distance of the shift of the light caused by the wedges. There are other mathematical methods that could be used to map the intensity which do not require this, for example, a polynomial approach could be used.

The embodiment described provides the advantage of absolute pupil uniformity measurement, without the need for an accurate measurement tool.

It will be appreciated that by effectively tilting the illumination source with respect to the detector D and the projection lens system PS, the same part of the detector D measures a different part of the illumination source. Tilting can be done by using small prisms (or wedges W) on top of the mask (in between the illuminator IL & a pinhole in the object plane "o"). By doing so the illuminator IL is measured independently of the detector D and the projection lens system PS.

Likewise by tilting the detector D with respect to the projection lens (and illuminator IL), the intensity distribution at the projection lens pupil can be measured at substrate level (independent of the detector).

By a combination of both, the illumination pupil filling, lens apodization and detector response can be measured independently.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of measuring angular intensity distribution of an illumination beam produced by an illumination system of a lithographic apparatus having an illumination system which is configured to condition a radiation beam and to focus the radiation beam in an object plane, a support constructed to support a patterning device for imparting the radiation beam with a pattern in its cross-section to form a patterned radiation beam, a substrate table constructed to hold a substrate and a projection system configured to project the patterned radiation beam onto a target portion of the substrate, comprising:

placing a detector downstream of said projection system, and measuring an intensity distribution of radiation from said illumination system at said detector to produce a first measurement;

placing a first optical element above said object plane which causes radiation from said illumination system to be deflected in a first direction, and measuring an intensity distribution of said radiation deflected by the first optical element at said detector to produce a second measurement;

placing a second optical element above said object plane which causes radiation from said illumination system to be deflected in a second direction, and measuring an intensity distribution of said radiation deflected by the second optical element at said detector to produce a third measurement; and using said first, second and third measurements to determine the change in intensity in said first and second directions, and the angular intensity distribution of said illumination beam.

2. A method as in claim 1, wherein said first and second optical elements are the same optical element, and wherein the optical element is used with different rotations when serving as said first and second optical elements.

3. A method as in claim 1, wherein said first and second optical elements are wedges.

4. A method as in claim 1, wherein said first optical element is replaced by the second optical element during said step of placing the second optical element above said object plane.

5. A method as in claim 1, wherein said optical elements are made from synthetic quartz or fused silica.

6. A method as in claim 1, wherein the illumination system and the projection system each have a pupil, and wherein each of said optical elements causes radiation from the same part of the illumination system pupil to pass through a different part of the projection system pupil, and wherein the method includes using this fact to separate the transmission characteristics of the projection system from the illumination distribution of the illumination beam.

7. A method as in claim 1, which further comprises introducing one or more optical elements between the projection system and the detector, and calculating the transmission characteristics of the projection system separately from the response of the detector.

8. A method as in claim 1, which further comprises rotating the detector, and calculating the transmission characteristics of the projection system separately from the response of the detector.

9. A method of measuring the response of a detector to light falling on the detector, the method comprising:
- passing light through the projection system of a lithographic apparatus;
- positioning the detector downstream of the projection system;
- measuring the intensity distribution at said detector to produce a first intensity distribution measurement;
- rotating the detector and then measuring the intensity distribution at said detector to produce a second intensity distribution measurement; and
- comparing said first and second intensity distribution measurements to calculate the detector response separately from the transmission characteristics of the projection system.

10. A method as in claim 9, further comprising measuring an angular intensity distribution of an illumination beam produced by an illumination system of the lithographic apparatus by:
- measuring an intensity distribution of radiation from said illumination system at said detector to produce a first measurement;
- placing a first optical element above an object plane of the illumination system of the lithographic apparatus which causes radiation from said illumination system to be deflected in a first direction, and measuring an intensity distribution of said radiation deflected by the first optical element at said detector to produce a second measurement;
- placing a second optical element above said object plane which causes radiation from said illumination system to be deflected in a second direction, and measuring an intensity distribution of said radiation deflected by the second optical element at said detector to produce a third measurement; and
- using said first, second and third measurements to determine the change in intensity in said first and second directions, and the angular intensity distribution of said illumination beam.

11. A method as in claim 10, wherein said first and second optical elements are the same optical element, and wherein the optical element is used with different rotations when serving as said first and second optical elements.

12. A method as in claim 10, wherein said first and second optical elements are wedges.

13. A method as in claim 10, wherein said first optical element is replaced by the second optical element during said step of placing the second optical element above said object plane.

14. A method as in claim 10, wherein said optical elements are made from synthetic quartz or fused silica.

15. A method as in claim 10, wherein the illumination system and the projection system each have a pupil, and wherein each of said optical elements causes radiation from the same part of the illumination system pupil to pass through a different part of the projection system pupil, and wherein the method includes using this fact to separate the transmission characteristics of the projection system from the illumination distribution of the illumination beam.

16. A method as in claim 10, which further comprises introducing one or more optical elements between the projection system and the detector, and calculating the transmission characteristics of the projection system separately from the response of the detector.

17. A lithographic apparatus, comprising:
- an illumination system configured to condition a radiation beam and to focus the radiation beam in an object plane;
- a support constructed to support a patterning device, the patterning device arranged to impart the radiation beam with a pattern in its cross-section to form a patterned radiation beam;
- a substrate table constructed to hold a substrate;
- a projection system configured to project the patterned radiation beam onto a target portion of the substrate;
- a detector, positionable downstream of said projection system, configured to measure an intensity distribution of a radiation from the illumination system at said detector to produce a first measurement;
- a first optical element, positionable above said object plane, to cause radiation from said illumination system to be deflected in a first direction, the detector is configured to measure an intensity distribution of radiation deflected by the first optical element at said detector to produce a second measurement;
- a second optical element, positionable above said object plane, to cause radiation from said illumination system to be deflected in a second direction, the detector configured to measure an intensity distribution of radiation deflected by the second optical element at said detector to produce a third measurement,
- wherein the first, second and third measurements are used to determine the change in intensity in said first and second directions, and the angular intensity distribution of said illumination beam.

18. A lithographic apparatus, comprising:
- a projection system configured to project a patterned radiation beam onto a target portion of the substrate;
- a detector positionable downstream of the projection system and being rotateable,
- wherein a response of the detector to radiation falling on the detector is determined by measuring an intensity distribution of light at said detector to produce a first intensity distribution measurement, rotating the detector and then measuring the intensity distribution of light at said detector to produce a second intensity distribution measurement, and comparing said first and second intensity distribution measurements to calculate the detector response separately from the transmission characteristics of the projection system.

* * * * *